US012660721B2

(12) United States Patent
Wang et al.

(10) Patent No.: US 12,660,721 B2
(45) Date of Patent: Jun. 16, 2026

(54) REINFORCED SUBSTRATES TO MITIGATE UNDERFLOW STRESS AND PACKAGE WARP AND METHODS OF MAKING THE SAME

(71) Applicant: Taiwan Semiconductor Manufacturing Company Limited, Hsinchu (TW)

(72) Inventors: Chin-Hua Wang, New Taipei City (TW); Shu-Shen Yeh, Taoyuan City (TW); Chia-Kuei Hsu, Hsinchu City (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 1060 days.

(21) Appl. No.: 17/750,429

(22) Filed: May 23, 2022

(65) Prior Publication Data

US 2023/0378042 A1    Nov. 23, 2023

(51) Int. Cl.
*H10W 90/00* (2026.01)
*H10W 70/05* (2026.01)
(Continued)

(52) U.S. Cl.
CPC ......... *H10W 90/401* (2026.01); *H10W 70/05* (2026.01); *H10W 70/65* (2026.01);
(Continued)

(58) Field of Classification Search
CPC ........... H01L 23/49833; H01L 21/4857; H01L 23/13; H01L 23/145; H01L 23/49816; H01L 23/49822; H01L 23/49838; H01L 25/0655; H10W 90/401; H10W 90/701; H10W 70/685; H10W 90/00;
(Continued)

(56) References Cited

U.S. PATENT DOCUMENTS

2011/0210439 A1* 9/2011 Lim ........................ H01L 23/24
257/690
2013/0256022 A1* 10/2013 Kobayashi ........... H05K 1/0271
174/250

(Continued)

*Primary Examiner* — Michael Jung
(74) *Attorney, Agent, or Firm* — The Marbury Law Group, PLLC

(57) ABSTRACT

An embodiment package substrate may include a core portion including a first material having a first bulk modulus and a first coefficient of thermal expansion, and a reinforcing portion including a second material having a second bulk modulus and a second coefficient of thermal expansion. The second bulk modulus may be chosen to be greater than the first bulk modulus and the second coefficient of thermal expansion may be chosen to be less than the first coefficient of thermal expansion. The core portion may include a fiber-reinforced polymer material and the reinforcing portion may include silicon, silicon nitride, or a ceramic material. The second bulk modulus may be greater than or equal to 100 GPa and the second coefficient of thermal expansion may be less than 10 ppm/° C. The reinforcing portion may include four components each respectively located proximate to a respective corner of the package substrate.

20 Claims, 12 Drawing Sheets

100

(51) Int. Cl.
  *H10W 70/65*        (2026.01)
  *H10W 70/68*        (2026.01)
  *H10W 70/685*       (2026.01)
  *H10W 70/695*       (2026.01)
  *H10W 74/15*        (2026.01)

(52) U.S. Cl.
  CPC ......... *H10W 70/68* (2026.01); *H10W 70/685*
      (2026.01); *H10W 70/695* (2026.01); *H10W*
      *90/00* (2026.01); *H10W 90/701* (2026.01);
        *H10W 70/095* (2026.01); *H10W 74/15*
      (2026.01); *H10W 90/724* (2026.01); *H10W*
                          *90/734* (2026.01)

(58) Field of Classification Search
  CPC ... H10W 70/65; H10W 70/695; H10W 70/05;
                          H10W 70/68
  See application file for complete search history.

(56)              References Cited

U.S. PATENT DOCUMENTS

| | | | |
|---|---|---|---|
| 2015/0084207 A1* | 3/2015 | Chauhan | H01L 23/34 |
| | | | 438/118 |
| 2022/0068756 A1* | 3/2022 | Jang | H01L 24/73 |
| 2023/0268286 A1* | 8/2023 | Gowda | H01L 23/552 |
| | | | 257/668 |

\* cited by examiner

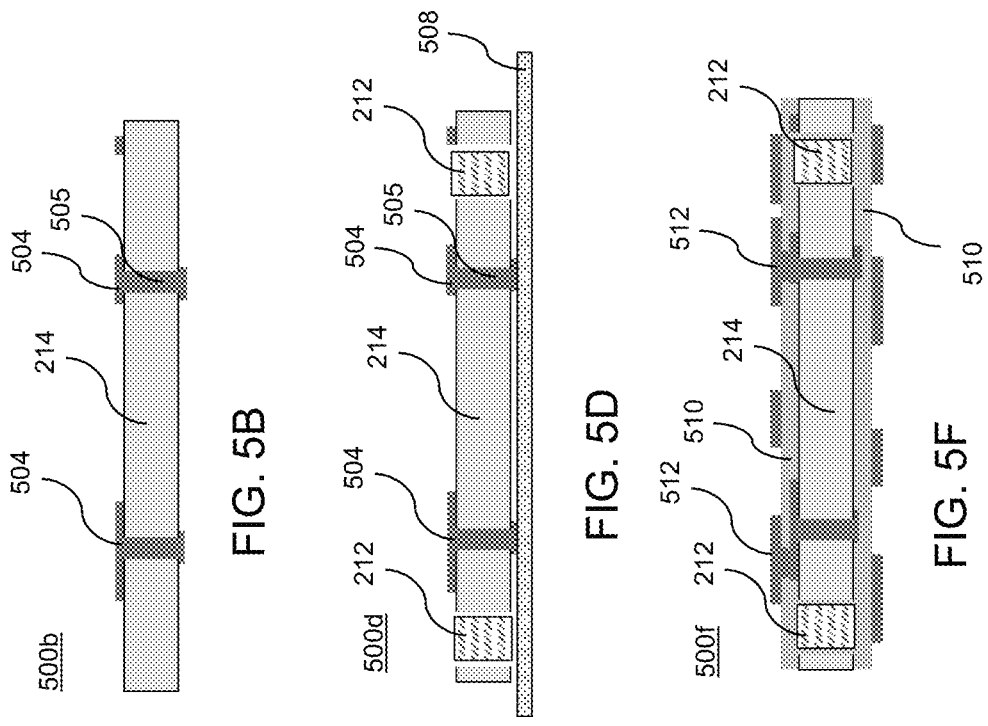
FIG. 5B
FIG. 5D
FIG. 5F
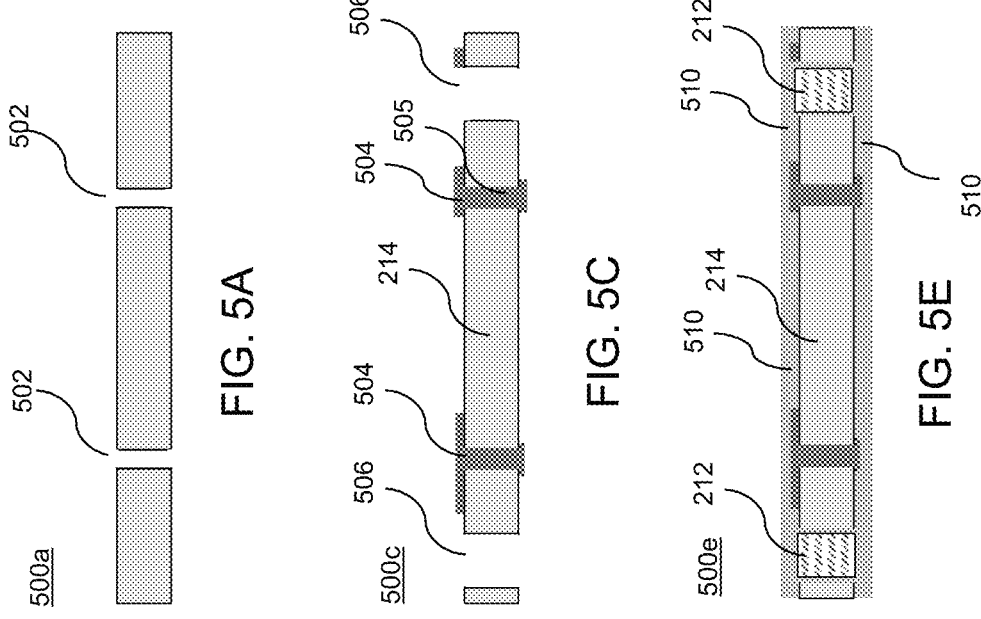
FIG. 5A
FIG. 5C
FIG. 5E

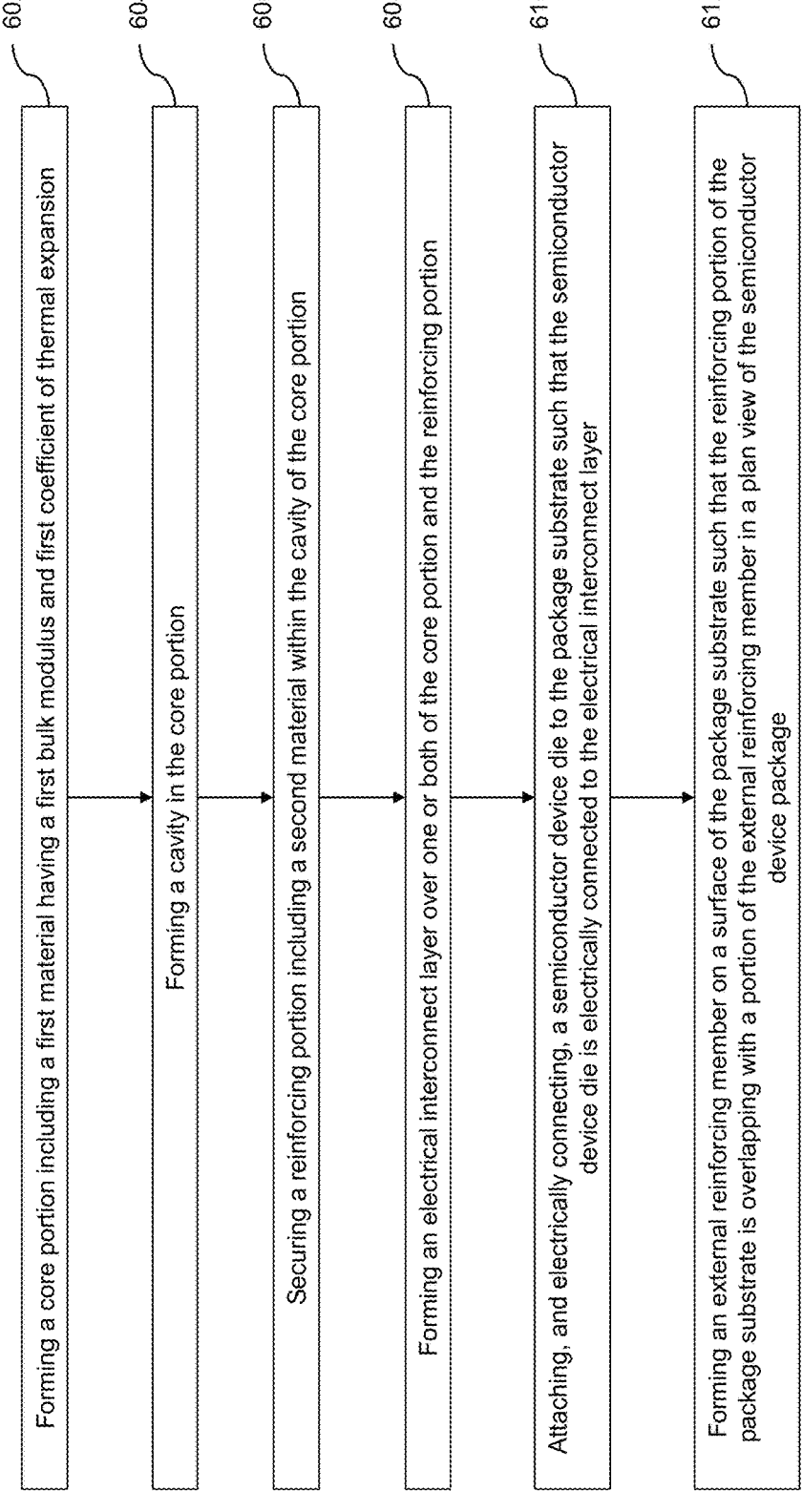

602

Forming a core portion including a first material having a first bulk modulus and first coefficient of thermal expansion

604

Forming a cavity in the core portion

606

Securing a reinforcing portion including a second material within the cavity of the core portion

608

Forming an electrical interconnect layer over one or both of the core portion and the reinforcing portion

610

Attaching, and electrically connecting, a semiconductor device die to the package substrate such that the semiconductor device die is electrically connected to the electrical interconnect layer

612

Forming an external reinforcing member on a surface of the package substrate such that the reinforcing portion of the package substrate is overlapping with a portion of the external reinforcing member in a plan view of the semiconductor device package

REINFORCED SUBSTRATES TO MITIGATE UNDERFLOW STRESS AND PACKAGE WARP AND METHODS OF MAKING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor sub-strate, and patterning the various material layers using lithography to form circuit components and elements thereon. Dozens or hundreds or thousands of integrated circuits are typically manufactured on a single semiconduc-tor wafer, and individual dies on the wafer are singulated by sawing between the integrated circuits along scribe lines. The individual dies are typically packaged separately, in multi-chip modules, or in other types of packaging, for example.

As semiconductor packages have become more complex, package sizes have tended to become larger to accommodate greater numbers of integrated circuits and/or dies per pack-age. These larger and more complex semiconductor pack-ages have created challenges in making effective and reli-able interconnections to the semiconductor package. Other challenges includes mechanical issues related to thermal expansion mismatch between package components leading to warpage, cracking, delamination, etc.

BRIEF DESCRIPTION OF THE DRAWINGS

Aspects of this disclosure are best understood from the following detailed description when read with the accom-panying figures. It is noted that, in accordance with the standard practice in the industry, various features are not drawn to scale. In fact, the dimensions of the various features may be arbitrarily increased or reduced for clarity of discussion.

FIG. 5A is a vertical cross-sectional view of an interme-diate structure that may be used in the fabrication of a semiconductor package substrate, according to various embodiments.

FIG. 5B is a vertical cross-sectional view of a further intermediate structure that may be used in the fabrication of a semiconductor package substrate, according to various embodiments.

FIG. 5C is a vertical cross-sectional view of a further intermediate structure that may be used in the fabrication of a semiconductor package substrate, according to various embodiments.

FIG. 5D is a vertical cross-sectional view of a further intermediate structure that may be used in the fabrication of a semiconductor package substrate, according to various embodiments.

FIG. 5E is a vertical cross-sectional view of a further intermediate structure that may be used in the fabrication of a semiconductor package substrate, according to various embodiments.

FIG. 5F is a vertical cross-sectional view of a further intermediate structure that may be used in the fabrication of a semiconductor package substrate, according to various embodiments.

FIG. 6 is a flow chart illustrating various operations of a method of fabricating a package substrate, according to various embodiments.

DETAILED DESCRIPTION

Figure 1A:
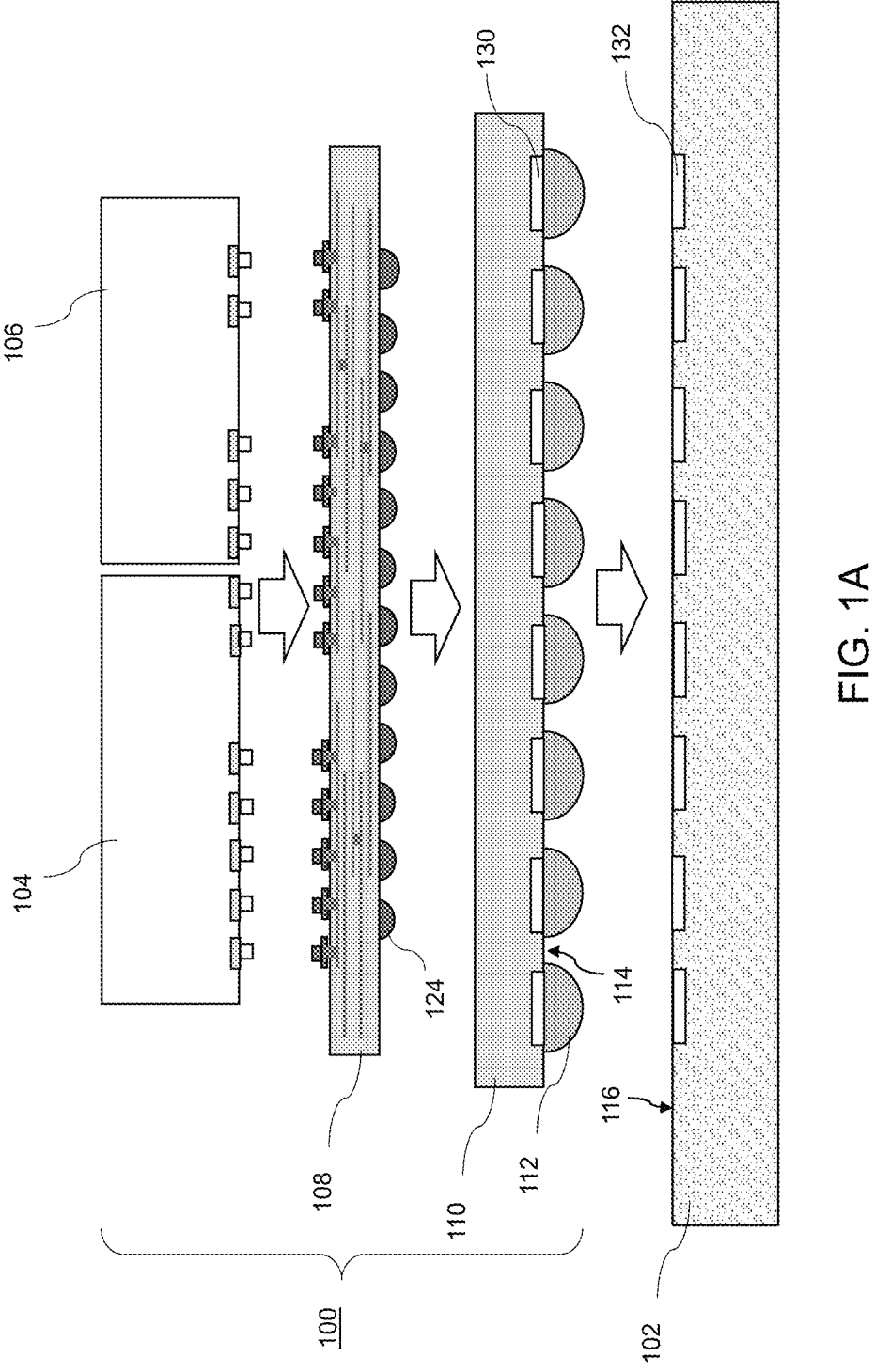
FIG. 1A is vertical cross-sectional exploded view of components of a semiconductor package during a package assembly and surface mounting process.

The following disclosure provides many different embodiments, or examples, for implementing different fea-tures of the provided subject matter. Specific examples of components and arrangements are described below to sim-plify this disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, this disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package a number of semiconductor integrated circuit (IC) dies (i.e., "chips") may be mounted onto a common substrate, which may also be referred to as a "package substrate." In some embodiments, electrical connections to the semiconductor package may be made by mounting the package substrate onto a support substrate containing electrical interconnects, such as a printed circuit board (PCB).

The various embodiments disclosed herein provide improved methods for assembling semiconductor packages that mitigate mechanical issues related to thermal expansion mismatch between package components that may otherwise cause warpage, cracking, delamination, etc. issues in the semiconductor package. Package substrates may be reinforced with an external reinforcing member that may reduce or eliminate warpage of the package substrate. Thermal expansion coefficient mismatch between the external reinforcing member and other components, however, may give rise to cracking, delamination, and other mechanical degradation of the semiconductor package. To mitigate against such issues related to thermal expansion coefficient mismatch, various disclosed embodiments further provide a reinforcing portion formed within the semiconductor package substrate. The reinforcing portion may have a higher bulk modulus and lower thermal expansion coefficient than other portions of the semiconductor package substrate to thereby reduce or eliminate thermal-stress-induced damage to the semiconductor package substrate.

An embodiment package substrate may include a core portion including a first material having a first bulk modulus and a first coefficient of thermal expansion, and a reinforcing portion including a second material having a second bulk modulus and a second coefficient of thermal expansion. The second bulk modulus may be chosen to be greater than the first bulk modulus and the second coefficient of thermal expansion may be chosen to be less than the first coefficient of thermal expansion. The core portion may include a fiber-reinforced polymer material and the reinforcing portion may include silicon, silicon nitride, or a ceramic material. The second bulk modulus may be greater than or equal to 100 GPa and the second coefficient of thermal expansion may be less than 10 ppm/° C. The reinforcing portion may include four components each respectively located proximate to a respective corner of the package substrate.

An embodiment semiconductor package substrate may include a package substrate including a core portion having a first material and a reinforcing portion including a second material, and a semiconductor device attached to the package substrate and electrically coupled to the package substrate. The semiconductor package may further include an external reinforcing member formed on a surface of the package substrate, such that the reinforcing portion of the package substrate is overlapping with a portion of the external reinforcing member in a plan view of the semiconductor package. The first material may have a first bulk modulus and a first coefficient of thermal expansion, and the second material may have a second bulk modulus that is greater than the first bulk modulus and a second coefficient of thermal expansion that is less than the first coefficient of thermal expansion. The second bulk modulus may be greater than 100 GPa and the second coefficient of thermal expansion may be less than 10 ppm/C. The core portion may include a fiber-reinforced polymer material, and the reinforcing portion may include silicon, silicon nitride, or a ceramic material.

An embodiment method of forming a semiconductor package may include forming a core portion comprising a first material having a first bulk modulus and first coefficient of thermal expansion; forming a cavity in the core portion; and securing a reinforcing portion comprising a second material within the cavity of the core portion. The second material may be chosen to have a second bulk modulus that is greater than the first bulk modulus and a second coefficient of thermal expansion that is less than the first coefficient of thermal expansion. The method may further include forming an electrical interconnect layer over one or both of the core portion and the reinforcing portion; attaching, and electrically connecting, a semiconductor device to the package substrate such that the semiconductor device is electrically connected to the electrical interconnect layer; and forming an external reinforcing member on a surface of the package substrate such that the reinforcing portion of the package substrate is overlapping with a portion of the external reinforcing member in a plan view of the semiconductor package.

Figure 1B:
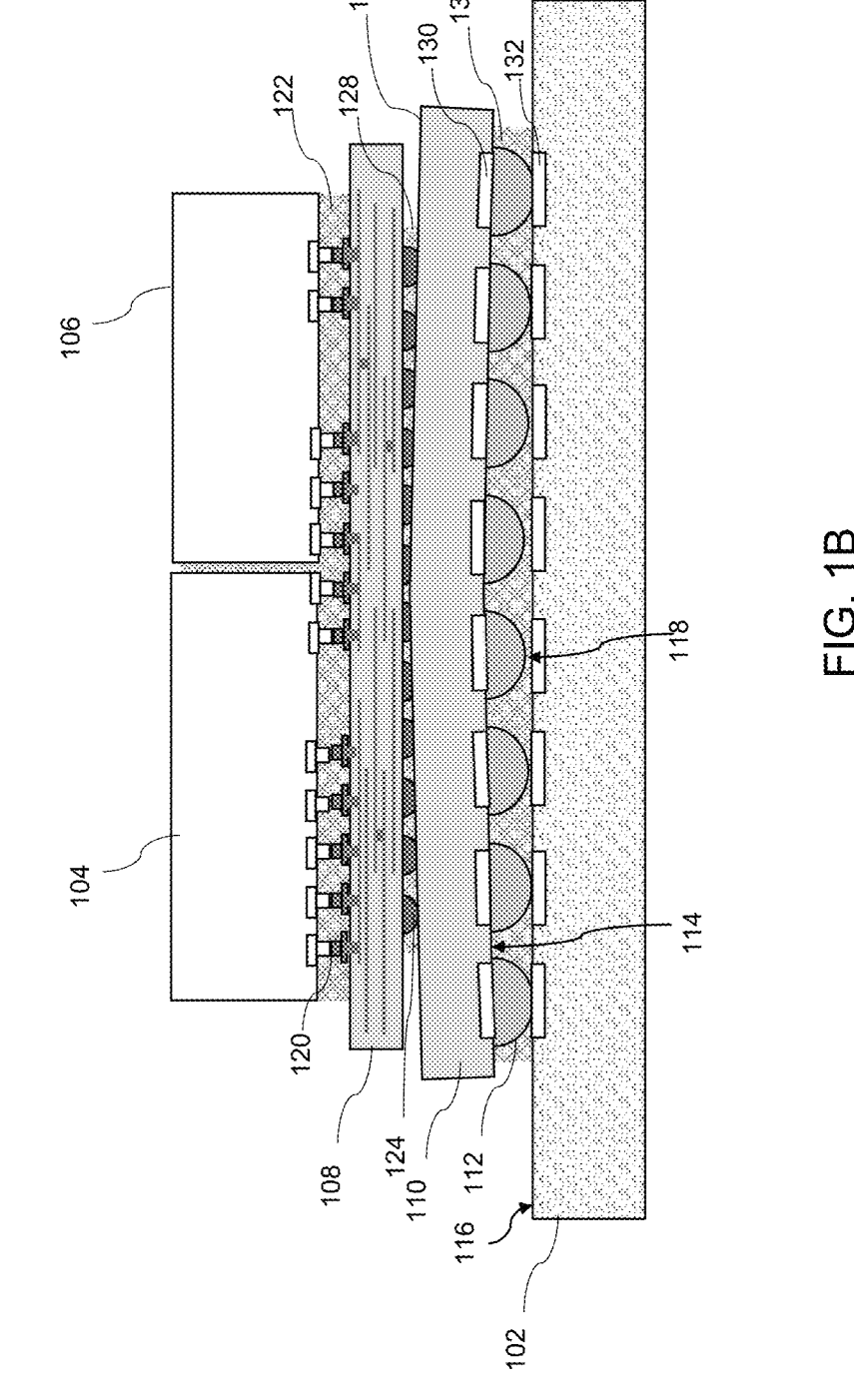
FIG. 1B is a vertical cross-sectional view illustrating an assembled semiconductor package mounted onto the surface of a support substrate.

FIG. 1A is vertical cross-section exploded view of components of a semiconductor package 100 during a package assembly and surface mounting process. FIG. 1B is a vertical cross-section view illustrating the assembled semiconductor package 100 mounted onto the surface of a support substrate 102, such as a printed circuit board (PCB). The semiconductor package 100 in this example is a chip-on-wafer-on-substrate (CoWoS)® semiconductor package, although it will be understood that a similar assembly and mounting process may be utilized for other types of semiconductor packages, such as integrated fan-out (InFO) semiconductor packages, flip-chip semiconductor packages, etc.

Referring to FIGS. 1A and 1B, the package 100 may include integrated circuit (IC) semiconductor devices, such as first IC semiconductor devices 104 and second IC semiconductor devices 106. During the package assembly process, the first IC semiconductor device 104 and the second IC semiconductor device 106 may be mounted on an interposer 108, and the interposer 108 containing the first IC semiconductor device 104 and the second IC semiconductor device 106 may be mounted onto a package substrate 110 to form a semiconductor package 100. The package 100 may then be mounted to a support substrate 102, such as a printed circuit board (PCB), by mounting the package substrate 110 to the support substrate 102 using an array of solder balls 112 on the lower surface 114 of the package substrate 110.

A parameter that may ensure proper interconnection between the package substrate 110 and the support substrate 102 is the degree of co-planarity between the surfaces of the solder balls 112 that may be brought into contact with the mounting surface (i.e., the upper surface 116 of the support substrate 102 in FIG. 1A). A low amount of co-planarity between the solder balls 112 may result in instances of solder cold joints (i.e., insufficient melting of the solder material, resulting in a poor bond that is susceptible to cracking and separation) and/or solder bridging issues (i.e., solder material from one solder ball 112 contacting material from a neighboring solder ball 112, resulting in an unintended connection (i.e., electrical short)) during the reflow process.

Deformation of the package substrate 110, such as stress-induced warping of the package substrate 110, may be a contributor to low co-planarity of the solder balls 112 during surface mounting of the package substrate 110 onto a support substrate 102. FIG. 1B illustrates a package substrate 110 that includes a warpage deformation. The warp deformation of the package substrate 110 may result in variations of the distance between the lower surface 114 of the package substrate 110 and the upper surface 116 support substrate 102. Such deformation of the package substrate 110 may increase the risk of defective solder connections with the underlying support substrate 102. As shown in FIG. 1B, for example, a deformation of the package substrate 110 may cause at least some of the solder joints between the package substrate 110 and the support substrate 102 to fail completely, as indicated by the arrow 118 in FIG. 1B. In the exemplary embodiment shown in FIG. 1B, the deformation of the package substrate 110 may have a bow-shape or cup-shape such that a separation between the lower surface 114 of the package substrate 110 and the upper surface 116 of the support substrate 102 may be smallest at the periphery of the package substrate 110 and may increase towards the center of the package substrate 110.

Deformation of the package substrate 110 is not an uncommon occurrence, particularly in the case of semiconductor packages used in high-performance computing applications. These high-performance semiconductor packages 100 tend to be relatively large and may include a number of IC semiconductor devices (e.g., 104, 106) mounted to the package substrate 110, which may increase a likelihood that the package substrate 110 may be subject to warping or other deformations. Such deformations may present challenges to effective solder mounting of these types of semiconductor package substrates 110 onto a support substrate 102.

According to various embodiments of this disclosure, a substrate for a semiconductor package 100 may include various reinforcing structures that may compensate for a deformation of the package substrate 110 so that the co-planarity of the solder balls 112 may be improved, thereby providing an improved solder connection between the package substrate 110 and the support substrate 102, as described in greater detail below.

In various embodiments, the first IC semiconductor devices 104 may be three-dimensional devices, such as three-dimensional integrated circuits (3DICs), System on Chip (SOC) or System on Integrated Circuit (SoIC) devices. A three-dimensional IC semiconductor device 104 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional IC semiconductor device 104 may also be referred to as a "first die stack."

The second IC semiconductor device(s) 106 may be different from the first IC semiconductor device(s) 104 in terms of their structure, design and/or functionality. The one or more second IC semiconductor devices 106 may be three-dimensional IC semiconductor devices, which may also be referred to as "second die stacks." In some embodiments, the one or more second IC semiconductor devices

106 may include a memory device, such as a high bandwidth memory (HBM) device. In the example shown in FIGS. 1A and 1B, the semiconductor package 100 may include a SOC die stack 104 and an HBM die stack 106, although it will be understood that the semiconductor package 100 may include greater or fewer numbers of IC semiconductor devices.

Referring again to FIG. 1B, the first IC semiconductor devices 104 and second IC semiconductor devices 106 may be mounted on an interposer 108. In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer 108 are within the contemplated scope of the disclosure. The interposer 108 may include a plurality of conductive bonding pads on upper and lower surfaces of the interposer and a plurality of conductive interconnects extending through the interposer 108 between the upper and lower bonding pads of the interposer 108. The conductive interconnects may distribute and route electrical signals between the first IC semiconductor devices 104, the second IC semiconductor devices 106, and the underlying package substrate 110. Thus, the interposer 108 may also be referred to as a redistribution layer (RDL).

A plurality of metal bumps 120, such as microbumps, may electrically connect conductive bonding pads on the bottom surfaces of the first IC semiconductor devices 104 and second IC semiconductor devices 106 to the conductive bonding pads on the upper surface of the interposer 108. In one non-limiting embodiment, metal bumps 120 in the form of microbumps may include a plurality of first metal stacks, such as a plurality of Cu—Ni—Cu stacks, located on the bottom surfaces of the first IC semiconductor devices 104 and second IC semiconductor devices 106, and a plurality of second metal stacks (e.g., Cu—Ni—Cu stacks) located on the upper surface of the interposer 108. A solder material, such as tin (Sn), may be located between respective first and second metal stacks to electrically connect the first IC semiconductor devices 104 and the second IC semiconductor devices 106 to the interposer 108. Other suitable materials for the metal bumps 120 are within the contemplated scope of disclosure.

After the first IC semiconductor devices 104 and second IC semiconductor devices 106 are mounted to the interposer 108, a first underfill material portion 122 may optionally be provided in the spaces surrounding the metal bumps 120 and between the bottom surfaces of the first IC semiconductor devices 104, the second IC semiconductor devices 106, and the upper surface of the interposer 108 as shown in FIG. 1B. The first underfill material portion 122 may also be provided in the spaces laterally separating adjacent first IC semiconductor devices 104 and second IC semiconductor devices 106 of the semiconductor package 100. In various embodiments, the first underfill material portion 122 may be include of an epoxy-based material, which may include a composite of resin and filler materials.

Referring again to FIG. 1B, the interposer 108 may be mounted on the package substrate 110 that may provide mechanical support for the interposer 108 and the first IC semiconductor devices 104 and second IC semiconductor devices 106 that are mounted on the interposer 108. The package substrate 110 may include a suitable material, such as an organic material (e.g., a polymer and/or thermoplastic material), a semiconductor material (e.g., a semiconductor wafer, such as a silicon wafer), a ceramic material, a glass material, combinations thereof, or the like. Other suitable substrate materials are within the contemplated scope of present disclosure. In various embodiments, the package substrate 110 may include a plurality of conductive bonding pads (not shown) in an upper surface 126 of the package substrate 110. A plurality of metal bumps 124, such as C4 solder bumps, may electrically connect conductive bonding pads (not shown) on the bottom surface of the interposer 108 to the conductive bonding pads on the upper surface 126 of the package substrate 110. In various embodiments, the metal bumps 124 may include a suitable solder material, such as tin (Sn), although other suitable solder materials are within the contemplated scope of disclosure.

A second underfill material portion 128 may be provided in the spaces surrounding the metal bumps 124 and between the bottom surface of the interposer 108 and the upper surface 126 of the package substrate 110 as illustrated, for example, in FIG. 1B. In various embodiments, the second underfill material portion 128 may include an epoxy-based material, which may include a composite of resin and filler materials. In some embodiments, a lid or cover (not shown in FIGS. 1A and 1B) may be mounted to the package substrate 110 and may provide an enclosure around the upper and side surfaces of the first IC semiconductor devices 104 and second IC semiconductor devices 106.

As described above, the package substrate 110 may be mounted to the support substrate 102, such as a printed circuit board (PCB). Other suitable support substrates 102 are within the contemplated scope of disclosure. The package substrate 110 may include a plurality of conductive bonding pads 130 in a lower surface 114 of the package substrate 110. A plurality of conductive interconnects (not shown) may extend through the package substrate 110 between conductive bonding pads on the upper surface 126 and lower surface 114 of the package substrate 110. The plurality of solder balls (or bump structures) 112 may electrically connect the conductive bonding pads 130 on the lower surface 114 of the package substrate 110 to a plurality of conductive bonding pads 132 on the upper surface 116 of the support substrate 102.

The bonding pads 130 of the package substrate 110 and bonding pads 132 of the support substrate 102 may be formed of a suitable conductive material, such as copper. Other suitable conductive materials are within the contemplated scope of disclosure. The plurality of solder balls 112 on the lower surface 114 of the package substrate 110 may form an array of solder balls 112, such as a ball grid array (BGA) that may include an array pattern that corresponds to an array pattern of the conductive bonding pads 132 on the upper surface 116 of the support substrate 102. In one non-limiting example, the array of solder balls 112 may include a grid pattern and may have a pitch (i.e., distance between the center of each solder ball 112 and the center of each adjacent solder ball 112). In an example embodiment, the pitch may be between about 0.8 and 1.0 mm, although larger and smaller pitches may be used.

The solder balls 112 may include any suitable solder material, such as tin, lead, silver, indium, zinc, nickel, bismuth, antimony, cobalt, copper, germanium, alloys thereof, combinations thereof, or the like. Other suitable materials for the solder balls 112 are within the contemplated scope of disclosure.

In some embodiments, the lower surface 114 of the package substrate 110 may include a coating of solder resist (SR) material (not shown), which may also be referred to as a "solder mask". A SR material coating may provide a protective coating for the package substrate 110 and any underlying circuit patterns formed on or within the package substrate 110. An SR material coating may also inhibit solder material from adhering to the lower surface 114 of the package substrate 110 during a reflow process. In embodiments in which the lower surface 114 of the package substrate 110 includes an SR coating, the SR material coating may include a plurality of openings through which the bonding pads 130 may be exposed.

In various embodiments, each of the conductive bonding pads 130 in different regions of the package substrate 110 may have the same size and shape. In the embodiment shown in FIGS. 1A and 1B, the surfaces of the bonding pads 130 may be substantially co-planar with the lower surface 114 of the package substrate 110, which in some embodiments may include a solder resist (SR) coating. Alternatively, the surfaces of the bonding pads 130 may be recessed relative to the lower surface 114 of the package substrate 110. In some embodiments, the surfaces of the bonding pads 130 may be raised relative to the lower surface 114 of the package substrate 110.

Referring again to FIGS. 1A and 1B, solder balls 112 may be provided over the respective conductive bonding pads 130. In one non-limiting example, the conductive bonding pads 130 may have a width dimension that is between about 500 μm and about 550 μm (e.g., ~530 μm), and the solder balls 112 may have an outer diameter that may be between about 600 μm and about 650 μm (e.g., ~630 μm), although greater and lesser dimensions for the solder balls 112 and/or the bonding pads 130 are within the contemplated scope of disclosure.

A first solder reflow process may include subjecting the package substrate 110 to an elevated temperature (e.g., at least about 250° C.) in order to melt the solder balls 112 and cause the solder balls 112 to adhere to the conductive bonding pads 130. Following the first reflow process, the package substrate 110 may be cooled causing the solder balls 112 to re-solidify. Following the first solder reflow process, the solder balls 112 may adhere to the conductive bonding pads 130. Each solder ball 112 may extend from the lower surface 114 of the package substrate 110 by a vertical height that may be less than the outer diameter of the solder ball 112 prior to the first reflow process. For example, where the outer diameter of the solder ball 112 is between about 600 μm and about 650 μm (e.g., ~630 μm), the vertical height of the solder ball 112 following the first reflow process may be between about 500 μm and about 550 μm (e.g., ~520 μm).

In various embodiments, the process of mounting the package substrate 110 onto the support substrate 102 as shown in FIG. 1B, may include aligning the package substrate 110 over the support substrate 102, such that the solder balls 112 contacting the conductive bonding pads 130 of the package substrate 110 may be located over corresponding bonding pads (e.g., bonding pads 132) on the support substrate 102. A second solder reflow process may then be performed. The second solder reflow process may include subjecting the package substrate 110 to an elevated temperature (e.g., at least about 250° C.) to thereby melt the solder balls 112 and cause the solder balls 112 to adhere to the corresponding bonding pads 132 on the support substrate 102. Surface tension may cause the semi-liquid solder to maintain the package substrate 110 in alignment with the support substrate 102 while the solder material cools and solidifies. Upon solidification of the solder balls 112, the package substrate 110 may sit above the upper surface 116 of the support substrate 102 by a stand-off height that may be between about 0.4 mm to about 0.5 mm, although greater or lesser stand-of heights are within the contemplated scope of disclosure.

Following the mounting of the package substrate 110 to the surface substrate 102, a third underfill material portion 134 may be provided in the spaces surrounding the solder balls 112 and between the lower surface 114 of the package substrate 110 and the upper surface 116 of the support substrate 102, as is shown in FIG. 1B. In various embodiments, the third underfill material portion 134 may include an epoxy-based material, which may include a composite of resin and filler materials.

Figure 2A:
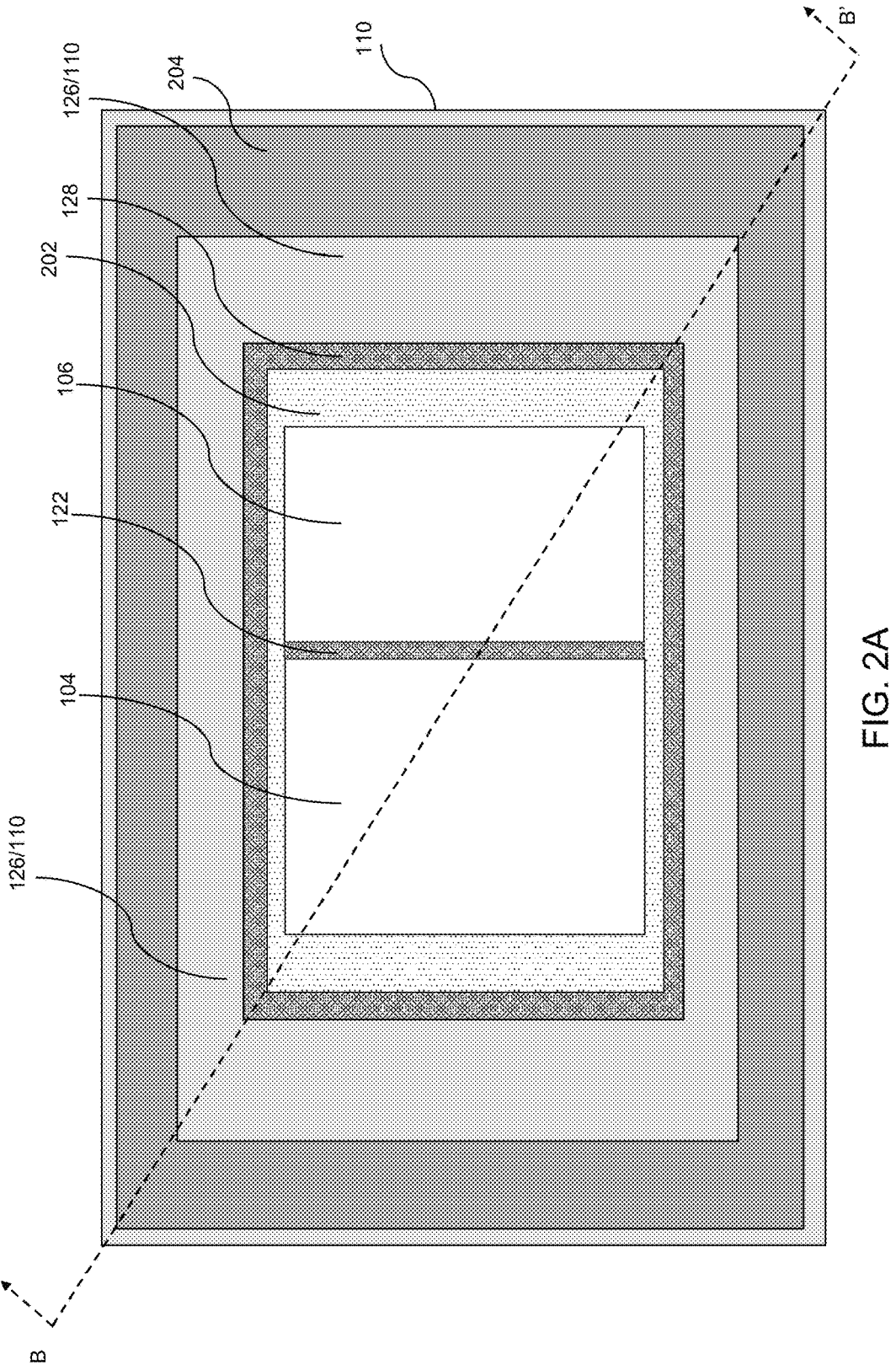
FIG. 2A is a top view of a semiconductor package including a first reinforcement structure.

FIG. 2A is a top view of a semiconductor package 200 including a first reinforcement structure 204, which may be provided to reduce or eliminate the warpage distortion of the package substrate 110 shown in FIG. 1B. The dashed line labeled B-B' indicates the cross-sectional view of the semiconductor package 200 shown in FIG. 2B, as described in greater detail, below. The semiconductor package 200 may be similar to the semiconductor package 100 of FIGS. 1A and 1B. In this regard, the semiconductor package 200 may include a first IC semiconductor device 104 and a second IC semiconductor device 106 mounted to an interposer 108 (e.g., see FIG. 2B). The interposer 108 may be mounted to a package substrate 110, as described above with reference to FIGS. 1A and 1B. The semiconductor package 200 may include a first underfill material portion 122 provided in the spaces laterally separating adjacent first IC semiconductor device 104 and second IC semiconductor device 106 of the semiconductor package 200. The semiconductor package 200 may also include a second underfill material portion 128 may be provided in the spaces surrounding the metal bumps 124 and between the bottom surface of the interposer 108 and the upper surface 126 of the package substrate 110 as illustrated, for example, in FIG. 2B.

The semiconductor package 200 may further include an epoxy molding compound (EMC) that may be applied to gaps formed between the interposer 108, the first IC semiconductor device 104, and the second IC semiconductor device 106, to thereby form a multi-die EMC frame 202. The EMC material may include an epoxy-containing compound that may be hardened (i.e., cured) to provide a dielectric material portion having sufficient stiffness and mechanical strength. The EMC material may include epoxy resin, hardener, silica (as a filler material), and other additives. The EMC material may be provided in a liquid form or in a solid form depending on the viscosity and flowability.

Liquid EMC may provide better handling, good flow ability, fewer voids, better fill, and fewer flow marks. Solid EMC may provide less cure shrinkage, better stand-off, and less die drift. A high filler content (such as 85% in weight) within an EMC material may shorten the time in mold, lower the mold shrinkage, and reduce the mold warpage. A uniform filler size distribution in the EMC material may reduce flow marks, and may enhance flowability. The curing temperature of the EMC material may be in a range from 125° C. to 150° C. The EMC frame 202 may be cured at a curing temperature to form an EMC matrix that laterally encloses each of the first IC semiconductor device 104 and the second IC semiconductor device 106. Excess portions of the EMC frame 202 may be removed from above the horizontal plane including the top surfaces of the semiconductor devices (104, 106) by a planarization process, such as CMP.

Figure 2B:
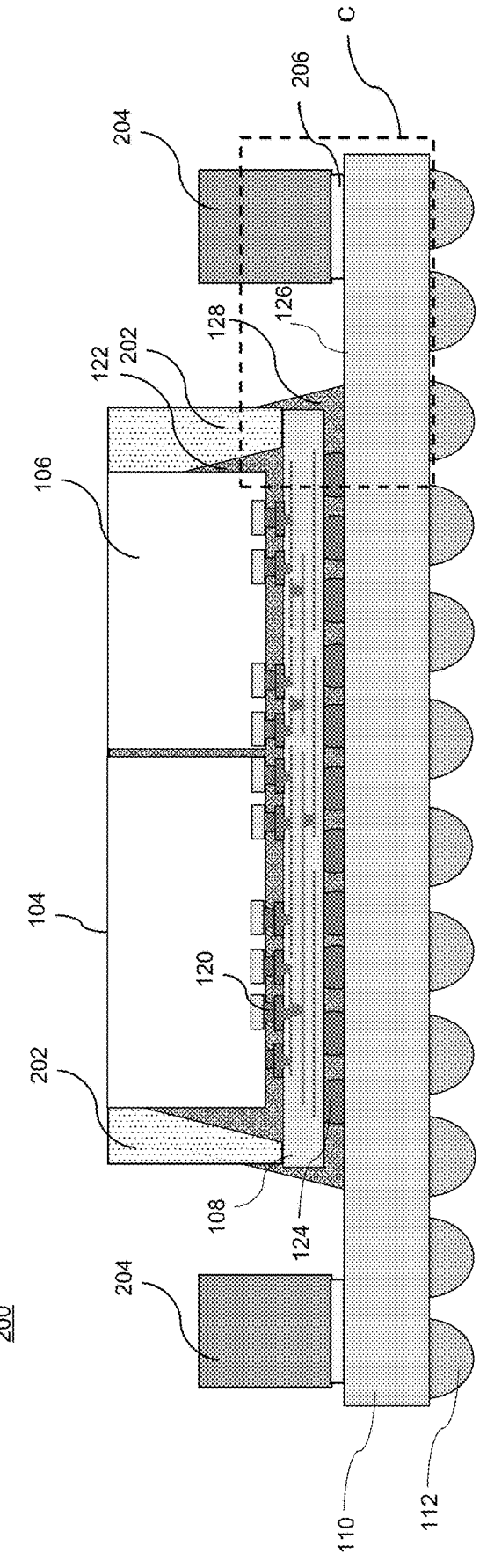
FIG. 2B is a vertical cross-sectional view of the semi-conductor package along line BB' in FIG. 2A.

FIG. 2B is a cross-sectional view of the semiconductor package 200 of FIG. 2A. The first reinforcement structure 204 may be attached to the package substrate 110 with an adhesive 206 and may be formed of a metal, an insulator, a semiconductor, a ceramic, etc. For example, in one embodiment, the first reinforcement structure 204 may include copper at an atomic percentage greater than 80%, such as greater than 90% and/or greater than 95% although greater or lesser percentages may be used. As shown in FIG. 2A, the first reinforcement structure 204 may be configured as a ring located around a periphery of the package substrate 110. As such, the first reinforcement structure 204 may form a single structure. Alternatively, the first reinforcement structure 204 may include several disconnected portions (not shown). Further, the first reinforcement structure 204 need not be located near the periphery of the package substrate 110. Rather, the first reinforcement structure 204 may located on the package substrate 110 in any region that may be subject to mechanical distortions such as warping.

The first reinforcement structure 204 may provide increased mechanical support to the package substrate 110 to thereby reduce or eliminate mechanical distortions such as the warping of the package substrate 110 described above and illustrated, for example, in FIG. 1B. The first reinforcement structure 204 may therefore be chosen to have a mechanical strength (e.g., bulk modulus) that is greater than that of the package substrate 110. As discussed above, the package substrate 110 may include an organic material (e.g., a polymer and/or thermoplastic material), a semiconductor material (e.g., a semiconductor wafer, such as a silicon wafer), a ceramic material, a glass material, combinations thereof, etc. As such, the choice of material for the first reinforcement structure 204 may be chosen based on the mechanical properties of the package substrate 110. As shown in FIG. 2B, for example, the presence of the first reinforcement structure 204 may reduce or eliminate the warpage distortion of the package substrate 110 shown in FIG. 1B. However, the presence of the first reinforcement structure 204 may give rise to other mechanical issues as described in greater detail with reference to FIG. 2C, below.

Figure 2C:
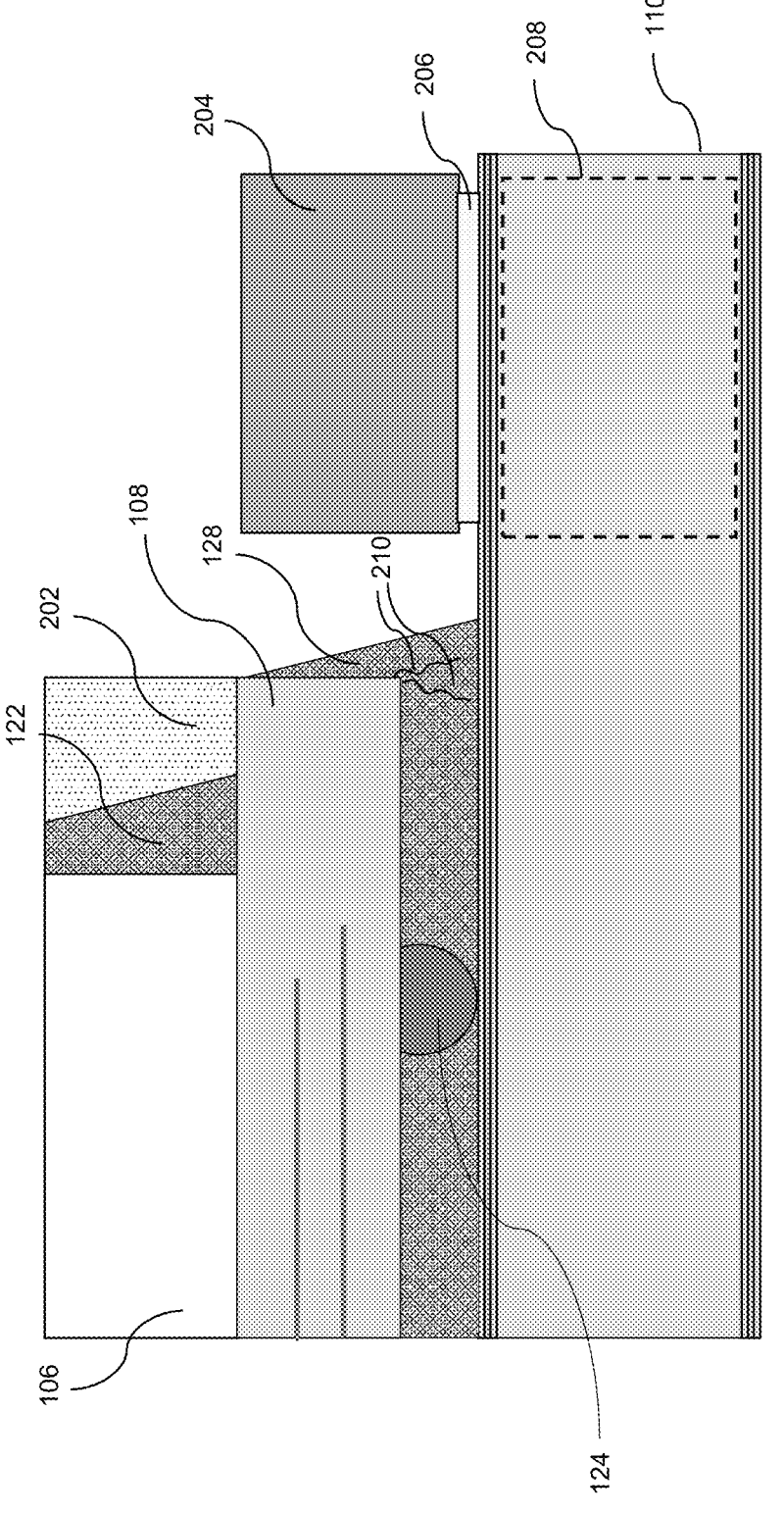
FIG. 2C is a vertical cross-sectional view of an enlarged portion of the semiconductor package of FIG. 2B.

FIG. 2C is a cross-sectional view of an enlarged portion of the semiconductor package of FIG. 2B. The region shown in FIG. 2C is illustrated in the dashed rectangle labeled C in FIG. 2B. For certain material compositions, there may be a mismatch in thermal expansion coefficients of components of the semiconductor package 200 relative to a thermal expansion coefficient of the first reinforcement structure 204. As such, thermal expansion stresses may develop during thermal cycling. Such thermal stresses may lead to mechanical degradation of the semiconductor package 200. For example, as shown in FIG. 2C, cracks 210 may develop in the second underfill material portion 128. Further, the second underfill material portion 128 may become delaminated (not shown) from the package substrate 110 and/or from the interposer 108. In various disclosed embodiments, a second reinforcement structure may be provided to compensate the thermal stresses developed between components of the semiconductor package 200 the first reinforcement structure 204. For example, a second reinforcement structure may be formed within the package substrate 110 (e.g., within region 208), as described in greater detail, below.

Figure 3A:
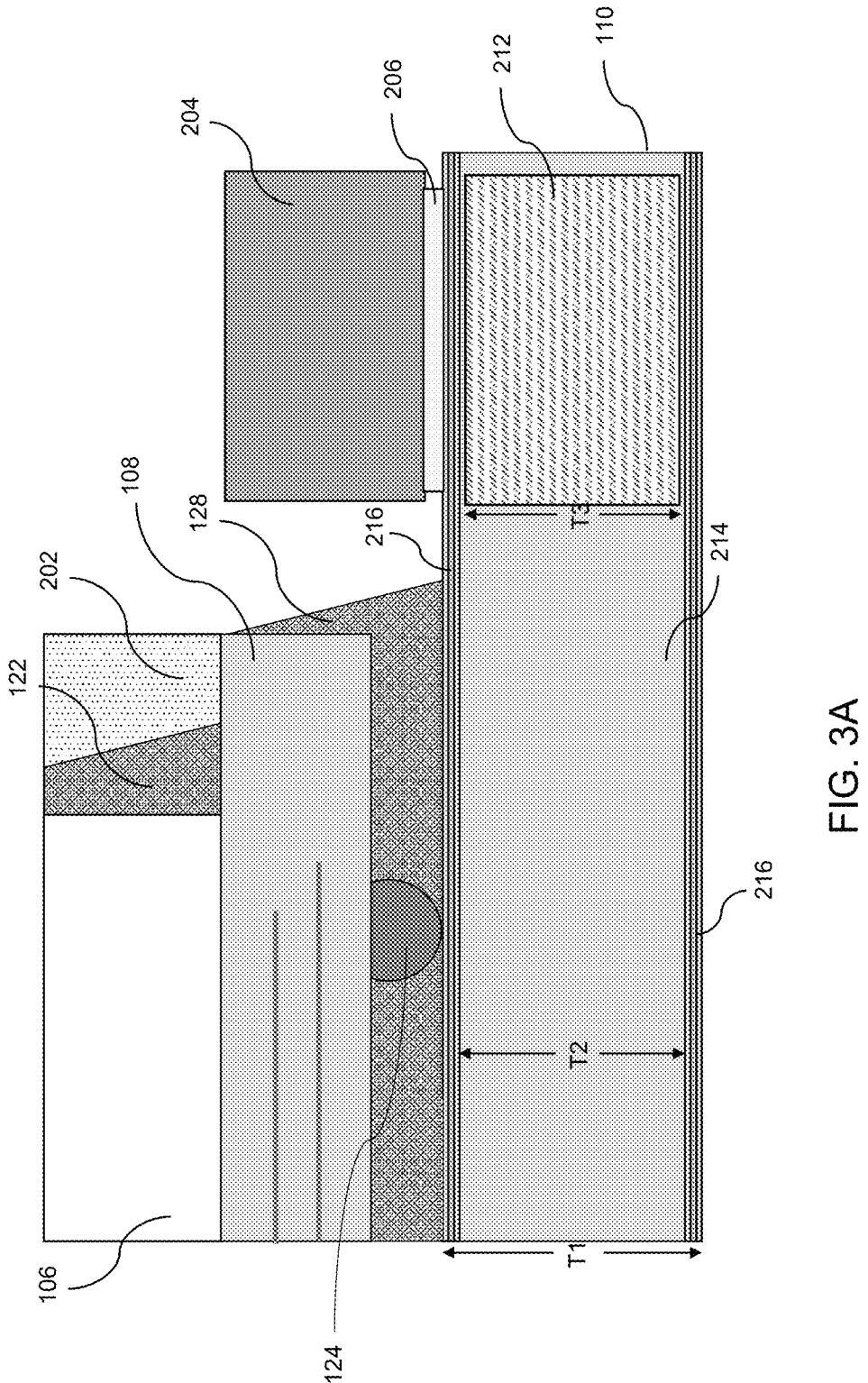
FIG. 3A is a vertical cross-sectional view of an enlarged portion of a semiconductor package having a second rein-forcement structure, according to various embodiments.
Figures 3B, 4A:
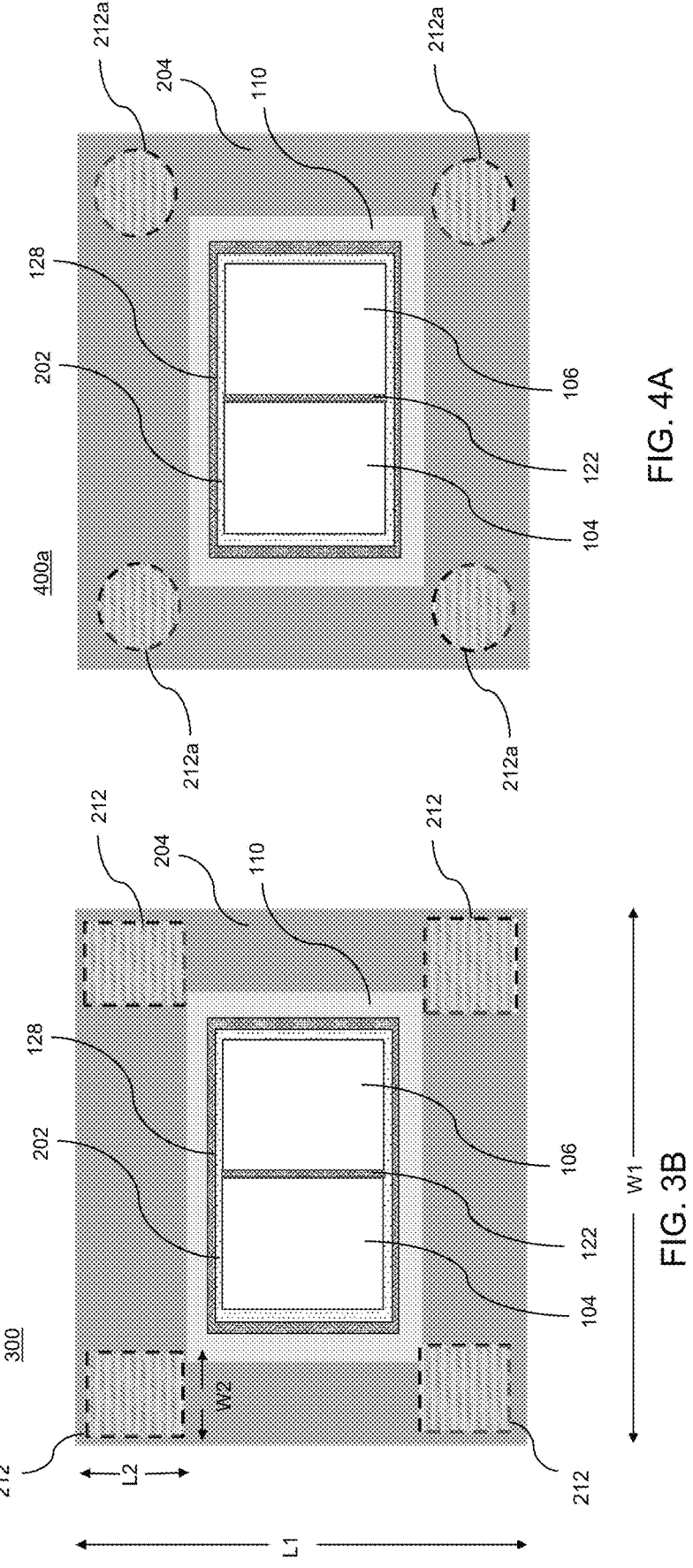
FIG. 3B is a top view of the semiconductor package of FIG. 3A, according to various embodiments.
FIG. 4A is a top view of a semiconductor package having a further configuration of the second reinforcement struc-ture, according to various embodiments.

FIG. 3A is vertical cross-sectional view of an enlarged portion of a semiconductor package 300 having a second reinforcement structure 212, and FIG. 3B is a top view of the semiconductor package 300 of FIG. 3A, according to various embodiments. The second reinforcement structure 212 may be formed within the package substrate 110 and may be configured to mitigate against various stresses caused by a mismatch in the thermal expansion coefficients of the first reinforcement structure 204 and other components of the semiconductor package 300, as described in greater detail, below.

The semiconductor package 300 may be similar to the semiconductor package 100 of FIGS. 1A and 1B and the semiconductor package 200 of FIGS. 2A to 2C. In this regard, the semiconductor package 300 may include a first IC semiconductor device 104 (e.g., see FIG. 3B) and a second IC semiconductor device 106 mounted to an interposer 108 (e.g., see FIG. 3A). The interposer 108 may be mounted to a package substrate 110, as described above with reference to FIGS. 1A to 2B. Alternatively, in some embodiments, the first IC semiconductor device 104 and the second IC semiconductor device 106 may be mounted directly to the package substrate 110 without the interposer 108. The semiconductor package 300 may include a first underfill material portion 122 provided in the spaces laterally separating adjacent first IC semiconductor device 104 and second IC semiconductor devices 106 of the semiconductor package 300. The semiconductor package 300 may also include a second underfill material portion 128 may be provided in the spaces surrounding the metal bumps 124 (e.g., see FIG. 3A) and between the bottom surface of the interposer 108 and the upper surface of the package substrate 110 as illustrated, for example, in FIGS. 3A and 3B.

The semiconductor package 300 may further include an EMC material that may be applied to gaps formed between the interposer 108, the first IC semiconductor device 104, and the second IC semiconductor device 106, to thereby form a multi-die EMC frame 202. The semiconductor package 300 may also include a first reinforcement structure 204 that may be attached to the package substrate 110 with an adhesive 206. As shown in FIG. 3B, the first reinforcement structure 204 may be configured as a ring structure located around a peripheral region of the semiconductor package 300 and may include a metal, insulator, semiconductor, ceramic material, etc. As such, the first reinforcement structure 204 may form a single connected structure.

As described above, however, the first reinforcement structure 204 may have other configurations in other embodiments. For example, the first reinforcement structure 204 may several disconnected portions (not shown). Further, the first reinforcement structure 204 need not be located near the periphery of the package substrate 110. Rather, the first reinforcement structure 204 may located on the package substrate 110 in any region that may be subject to mechanical distortions such as warping.

The second reinforcement structure 212 may be formed within the package substrate 110 as shown, for example, in FIG. 3A. In this regard, the package substrate 110 may include a core portion 214 including a first material having a first bulk modulus and a first coefficient of thermal expansion. For example, the core portion 214 may include a suitable material, such as an organic material (e.g., a polymer and/or thermoplastic material), a semiconductor material (e.g., a semiconductor wafer, such as a silicon wafer), a ceramic material, a glass material, combinations thereof, etc. Other suitable substrate materials are within the contemplated scope of present disclosure.

The package substrate 110 may further include a reinforcing portion (e.g., the second reinforcement structure 212) including a second material having a second bulk modulus and a second coefficient of thermal expansion. The materials forming the core portion 214 and the second reinforcement structure 212 may be chosen such that the second bulk modulus is greater than the first bulk modulus and the second coefficient of thermal expansion is less than the first coefficient of thermal expansion. In this regard, the second reinforcement structure 212 may be mechanically stronger and less susceptible to thermal expansion than the core portion 214. As such, the second reinforcement structure 212 may mitigate undesirable mechanical effects (e.g., warpage, cracking, delamination, etc.) that may otherwise be caused by the first reinforcement structure 204.

According to an embodiment, the core portion 214 may include a fiber-reinforced polymer material, and the second reinforcement structure 212 may include silicon, silicon nitride, or a ceramic material. Various other materials may be used for the core portion 214 and the second reinforcement structure 212 may be within the contemplated scope of this disclosure. The bulk modulus of the second reinforcement structure 212 may be chosen to be greater than 100 GPa. Further, the coefficient of thermal expansion of second reinforcement structure 212 may be less than 10 ppm/C.

As shown in FIG. 3B, the package substrate 110 may have a rectangular geometry and the second reinforcement structure 212 may include a plurality of separate components. In this example embodiment, the second reinforcement structure 212 includes rectangular portions located near each of the four corners of the package substrate. In other embodiments, the second reinforcement structure 212 may have various other shapes, as described in greater detail with reference to FIGS. 4A to 4E, below. The package substrate 110 may have a package length L1 and a package width W1. Similarly, each of the components of the second reinforcement structure 212 may have a reinforcement length L2 and a reinforcement width W2. Each of the package length L1 and the package width W1 may be in a range from approximately 20 mm to approximately 110 mm, although longer or shorter package lengths L1 and the package widths W1 may be implemented. The reinforcement length L2 may be in a range from approximately 1 mm to half the package length L1 (i.e., may satisfy 1 mm≤L2≤L1/2.0) and the reinforcement width W2 may be in a range from approximately 1 mm to half the package width W1 (i.e., may satisfy 1 mm≤W2≤W1/2.0).

As shown in FIG. 3A, the package substrate 110 may further include one or more electrical interconnect layers 216. An upper electrical interconnect layer 216 may be configured to electrically couple the interposer 108 to the package substrate 110 and a lower electrical interconnect layer 216 may be configured to electrically couple the package substrate 110 to the support substrate 102 (e.g., see FIGS. 1A and 1B). The package substrate 110 further may have package thickness T1 that is in a second range from approximately 300 microns to approximately 2,000 microns. The core portion 214 may have a core thickness T2 that is in a third range from approximately 200 microns to 1,600 microns. The second reinforcement structure 212 may include a reinforcement thickness T3 that is less than or equal to the core thickness T2.

FIGS. 4A to 4E provide top views of respective semiconductor packages (400a, 400b, 400c, 400d, 400e) having various configurations of the second reinforcement structure (212a, 212b, 212c, 212d, 212e), according to various respective embodiments. Each of the semiconductor packages (400a, 400b, 400c, 400d, 400e) may be similar to the semiconductor packages (200, 300) of FIGS. 2A to 3B. In this regard, each of the semiconductor packages (400a, 400b, 400c, 400d, 400e) may include a first IC semiconductor device 104 and a second IC semiconductor device 106 mounted to an interposer 108, which may be mounted to a package substrate 110, a first underfill material portion 122, a second underfill material portion 128, and an EMC material that forms a multi-die EMC frame 202, and first reinforcement structure 204 that may be attached to the package substrate 110 with an adhesive 206. As shown in FIGS. 4A to 4E, the first reinforcement structure 204 may be configured as a ring structure located around a peripheral region of the semiconductor package (400*a*, 400*b*, 400*c*, 400*d*, 400*e*), however, various other configurations of the first reinforcement structure 204 may be provided in other embodiments, as described above.

Figures 4B, 4C:
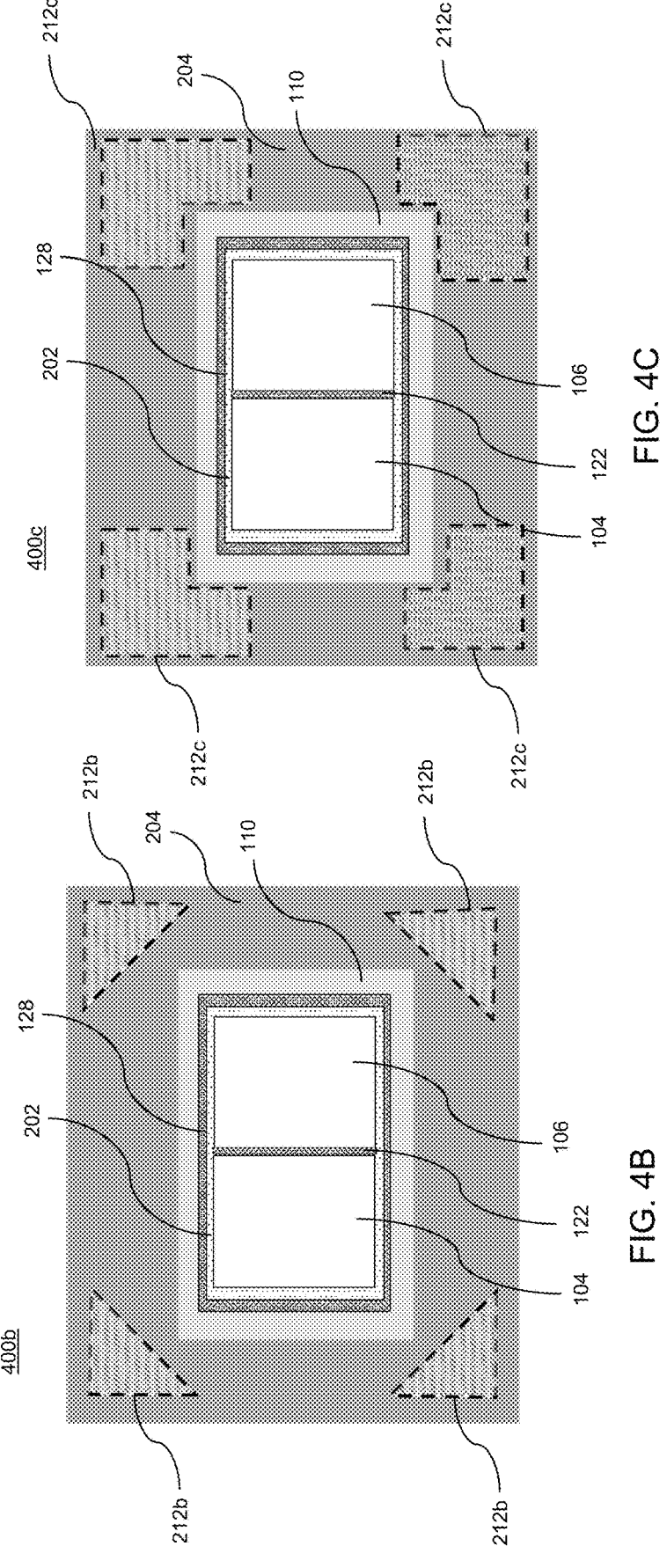
FIG. 4B is a top view of a semiconductor package having a further configuration of the second reinforcement struc-ture, according to various embodiments.
FIG. 4C is a top view of a semiconductor package having a further configuration of the second reinforcement struc-ture, according to various embodiments.
Figure 4E:
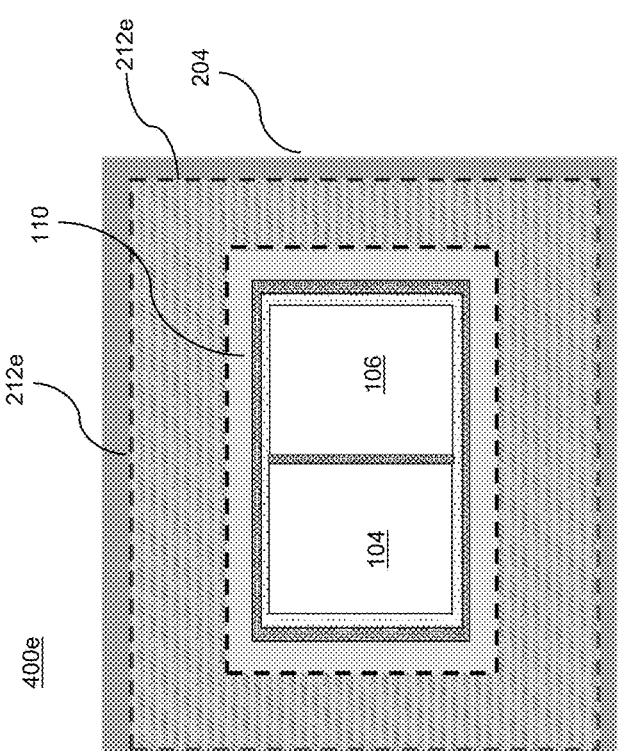
FIG. 4E is a top view of a semiconductor package having a further configuration of the second reinforcement struc-ture, according to various embodiments.
Figure 4D:
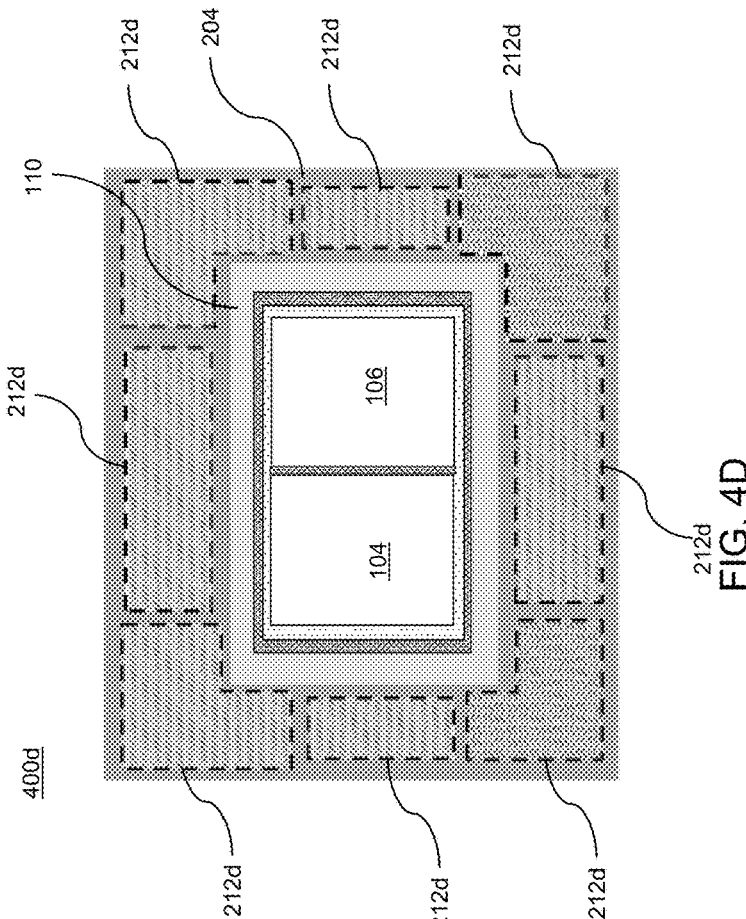
FIG. 4D is a top view of a semiconductor package having a further configuration of the second reinforcement struc-ture, according to various embodiments.

In each of the embodiments of FIGS. 4A to 4C, the package substrate 110 has a rectangular geometry and the second reinforcement structure (212*a*, 212*b*, 212*c*) may include four separate components located proximate to respective corners of the package substrate 110. In semiconductor package 400*a* of FIG. 4A, the second reinforcement structure 212*a* may include four components each having a circular horizontal cross sectional shape. Similarly, the four components of the second reinforcement structure 212*b* in the semiconductor package 400*b* of FIG. 4B may each have a triangular horizontal cross sectional shape. The four components of the second reinforcement structure 212*c* in the semiconductor package 400*c* of FIG. 4C may each have a rectangular polygon shape.

Various additional embodiments may include a second reinforcement structure having greater or fewer components. For example, the semiconductor package 400*d* of FIG. 4D may include a second reinforcement structure 212*d* including eight components. In this regard, the second reinforcement structure 212*d* may include four components each having a rectangular polygon shape located at four respective corners of the package substrate 110. These four components may be similar to the four components of the second reinforcement structure 212*c* of FIG. 4C. Unlike the semiconductor package 400*c* of FIG. 4C, however, the second reinforcement structure 212*d* of FIG. 4D may further include four respective edge portions, as shown. In a further embodiment, the second reinforcement structure 212*e* may include a single structure in the shape of a ring, as shown in the semiconductor package 400*e* of FIG. 4E. In this regard, the second reinforcement structure 212*e* may have a similar shape to the first reinforcement structure 204. Various other sizes, shapes, and material compositions for the second reinforcement structure are within the contemplated scope of the disclosure.

Figure 5H:
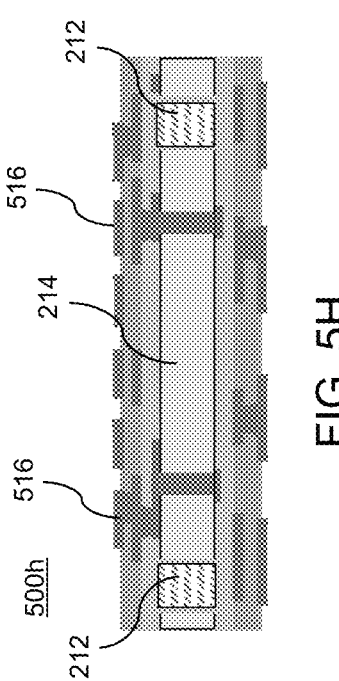
FIG. 5H is a vertical cross-sectional view of a further intermediate structure that may be used in the fabrication of a semiconductor package substrate, according to various embodiments.

FIG. 5A to 5H illustrate vertical cross-sectional views of various intermediate structures that may be used in the fabrication of a package substrate 110, according to various embodiments. FIG. 5A illustrates an intermediate structure 500*a* that may be used to form the core portion 214 (e.g., see FIG. 3A) of a package substrate 110. The intermediate structure 500*a* may include an organic material (e.g., a polymer and/or thermoplastic material), a semiconductor material (e.g., a semiconductor wafer, such as a silicon wafer), a ceramic material, a glass material, combinations thereof, etc. For example, the intermediate structure 500*a* may include an epoxy-based material, which may include a composite of resin and filler materials. The intermediate structure 500*a* may be formed in a slab geometry, as described above. The intermediate structure 500*a* may include through holes 502 may be drilled or otherwise formed in the intermediate structure 500*a*.

As shown in FIG. 5B, a further intermediate structure 500*b* may be formed from the intermediate structure 500*a* of FIG. 5A by forming a first conductive layer 504 including conductive via structures 505 within the through holes 502 of the intermediate structure 500*a* of FIG. 5A. The conductive via structures 505 may include a conductive material (e.g., Cu, Al, etc.) and may be formed, for example, by electroplating. Various other deposition techniques may be used within the contemplated scope of this disclosure. FIG. 5C illustrates a further intermediate structure 500*c* that may be formed from the intermediate structure 500*b* of FIG. 5B. For example, the intermediate structure 500*c* of FIG. 5C may be formed by creation of one or more cavities 506 (e.g., by drilling) in the intermediate structure 500*b* of FIG. 5B. The cavities 506 may be formed to each have a shape corresponding to the shape of a second reinforcement structure (212, 212*a*, 212*b*, 212*c*, 212*d*, 212*e*) to be formed in the package substrate 110. For example, the cavities 506 may have a rectangular shape, a circular shape, a triangle shape, a polygon shape, a ring shape, etc.

A further intermediate structure 500*d* (e.g., see FIG. 5D) may then be formed by placing components of the second reinforcement structure 212 within respective cavities 506 in the intermediate structure 500*c*, as shown in FIG. 5D. The intermediate structure 500*d* may be held together using a tape lamination method in which the intermediate structure 500*c* and the second reinforcement structure 212 are affixed to a tape 508 with an adhesive. A further intermediate structure 500*e* (e.g., see FIG. 5E) may be formed from the intermediate structure 500*d* by forming polymer layers 510 on both sides of the intermediate structure 500*d*. The polymer layers 510 may include polyethylene terephthalate (PET), polyimide (PI), an epoxy resin, etc. The polymer layers by a formed by placing a thin film polymer material on both sides of the intermediate structure 500*d*, which may then be vacuum laminated to the intermediate structure 500*d*. A heat treatment may then be applied to pre-cure the polymer layers 510. For example, the polymer layers 510 may be subjected to a heat treatment at 100° C. for less than thirty minutes. The pre-cure heat treatment may cause the polymer layers 510 to soften without appreciably initiating cross-linking reactions. The softened polymer layers 510 may flow and cover gaps in the intermediate structure 500*e*. The polymer layers 510 may then be laser patterned to form vias (not shown).

A thin electrically conducting layer (e.g., a layer of Cu or other conductive material) may then be formed over the intermediate structure 500*e* and the patterned vias to form conductive vias. A patterned photoresist may then be formed over the conductive vias and over the polymer layers 510. The photoresist may be provided in the form of a dry polymer film that may be laminated to both sides of the intermediate structure 500*e*. The photoresist may then be laser patterned using photolithography techniques. Conductive interconnect structures may then be formed by electroplating a conductive material (e.g., Cu) within exposed regions of the photoresist and over the previously deposited thin electrically conducting layer. The dry film photoresist may then be removed by dissolution with a solvent (e.g., sodium hydroxide, potassium hydroxide, acetone, etc.). The thin electrically conducting layer may then be etched while leaving the conductive interconnect structures. The remaining conductive structures and the conductive vias may thereby form a second conductive layer 512, as shown in the intermediate structure 500*f* of FIG. 5F.

Figure 5J:
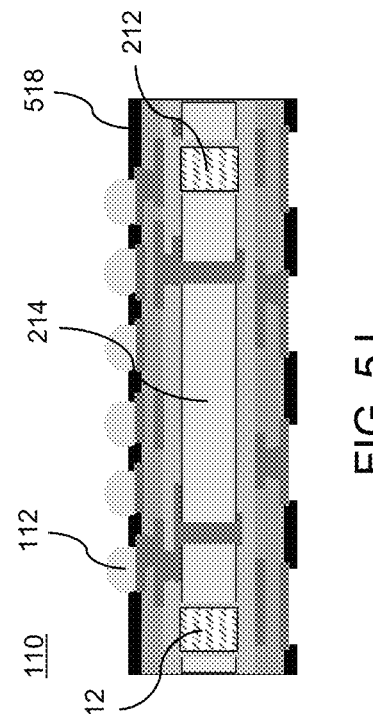
FIG. 5J is a vertical cross-sectional view of a semicon-ductor package substrate, according to various embodi-ments.
Figure 5G:
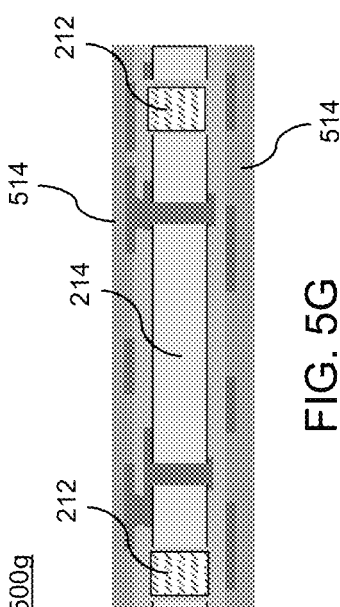
FIG. 5G is a vertical cross-sectional view of a further intermediate structure that may be used in the fabrication of a semiconductor package substrate, according to various embodiments.

The process of forming polymer layers 510 (e.g., see FIG. 5E) and conductive structures (e.g., see FIG. 5F) may then be repeated, as shown respectively in FIGS. 5G and 5H, to form a third conductive layer 514 that includes various interconnect structures. One or more additional conductive layers (e.g., 516) and polymer layers (not shown) may be formed in various embodiments. Once all polymer layers and conductive layers have been formed, a full-curing process may be performed. In this regard, the intermediate structure 500h of FIG. 5H may be subject to a heat treatment at temperatures between 180° C. to 190° C. for times between 60 and 90 minutes. This full-curing process may cause polymer cross-linking reactions to occur that increase the mechanical strength (i.e., cause hardening) of the polymer layers.

Figure 5I:
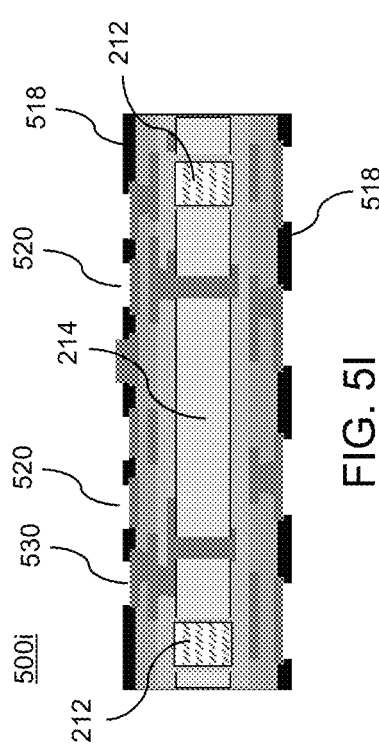
FIG. 5I is a vertical cross-sectional view of a further intermediate structure that may be used in the fabrication of a semiconductor package substrate, according to various embodiments.

FIG. 5I is a vertical cross-sectional view of a further intermediate structure 500i that may be used in the formation of a package substrate, according to various embodiments. In this regard, the intermediate structure 500i may be formed from the intermediate structure 500h by the formation of a solder mask 518 over the intermediate structure 500h of FIG. 5H. The solder mask 518 may include a coating of solder resist (SR) material which may provide a protective coating for the package substrate 110 and any underlying circuit patterns formed on or within the package substrate 110. An SR material coating may also inhibit solder material from adhering to the lower surface 114 of the package substrate 110 during a reflow process (e.g., see FIGS. 1A and 1B). In embodiments in which the lower surface 114 of the package substrate 110 includes an SR coating, the SR material coating may include a plurality of openings 520 through which the bonding pads 130 may be exposed.

FIG. 5J is a vertical cross-sectional view of a semiconductor package substrate 110, according to various embodiments. The package substrate 110 may be formed from the intermediate structure 500i by formation of a plurality of solder balls 112 over the bonding pads 530 of the intermediate structure 500i. The solder balls 112 may include any suitable solder material, such as tin, lead, silver, indium, zinc, nickel, bismuth, antimony, cobalt, copper, germanium, alloys thereof, combinations thereof, or the like. Other suitable materials for the solder balls 112 are within the contemplated scope of disclosure. As described above, the solder balls 112 may form a ball grid array (BGA) that may include an array pattern that corresponds to an array pattern of the conductive bonding pads 132 on the upper surface 116 of the support substrate 102 (e.g., see FIGS. 1A and 1B). In one non-limiting example, the array of solder balls 112 may include a grid pattern and may have a pitch (i.e., distance between the center of each solder ball 112 and the center of each adjacent solder ball 112). In an example embodiment, the pitch may be between about 0.8 and 1.0 mm, although larger and smaller pitches may be used. Further, the solder balls 112 may have an outer diameter that is between about 600 μm and about 650 μm (e.g., ~630 μm), although greater and lesser dimensions for the solder balls 112 are within the contemplated scope of disclosure.

FIG. 6 is a flow chart illustrating various operations of a method 600 of fabricating a package substrate 110, according to various embodiments. In operation 602, the method 600 may include forming a package substrate 110 by performing operations including forming a core portion 214 including a first material having a first bulk modulus and first coefficient of thermal expansion. For example, the first material may be a fiber-reinforced polymer material. In operation 604, the method 600 may further include forming a cavity 506 in the core portion 214 (e.g., see FIG. 5A). In operation 606, the method 600 may further include securing a reinforcing portion (e.g., second reinforcement structure 212; e.g., see FIG. 3A), including a second material, within the cavity 506 of the core portion 214 (e.g., see FIG. 5D). The second material may have a second bulk modulus that is greater than the first bulk modulus and a second coefficient of thermal expansion that is less than the first coefficient of thermal expansion. For example, the reinforcing portion 212 may include silicon, silicon nitride, or a ceramic material. In certain embodiments, the second bulk modulus may be greater than or equal to 100 GPa and the second coefficient of thermal expansion may be less than 10 ppm/° C.

In operation 608, the method 600 may further include forming an electrical interconnect layer (504, 512, 516) over one or both of the core portion 214 and the reinforcing portion 212 (e.g., see FIGS. 5B, 5F, and 5H). In operation 610, the method 600 may further include attaching, and electrically connecting, a semiconductor device (104, 106) to the package substrate 110 such that the semiconductor device (104, 106) is electrically connected to the electrical interconnect layer (504, 512, 516). In this regard, the semiconductor device (104, 106) may be directly connected to the package substrate 110 or may be connected to an interposer 108 which is connected to the package substrate (e.g., see FIGS. 1A to 2B and related description). In operation 612, the method 600 may further include forming an external reinforcing member (e.g., first reinforcement structure 204; e.g., see FIGS. 2A to 2C) on a surface 126 of the package substrate 110 such that the reinforcing portion 212 of the package substrate 110 is overlapping with a portion of the external reinforcing member 204 in a plan view of the semiconductor device package (e.g., see FIGS. 3A to 4E).

In further embodiments, the method 600 may further include forming the core portion 214 as a rectangular-shaped structure (e.g., see FIG. 3B); forming four cavities 506 in the core portion 214 located proximate to respective four corners of the core portion 214 (e.g., see FIGS. 3B to 4F); forming the reinforcing portion 212 as four components (e.g., see FIGS. 3B to 4C); and securing the four components to the respective four cavities 506 of the core portion 214 (e.g., see FIG. 5D). As described in greater detail above, the method 600 may further include forming the core portion 214 as an intermediate structure 500a (e.g., see FIG. 5A) including a fiber-reinforced polymer material; and forming the reinforcing portion 212 (e.g., see FIGS. 3A to 4C and 4D) as a second structure including silicon, silicon nitride, or a ceramic material.

Referring to all drawings and according to various embodiments of the present disclosure, a package substrate 110 (e.g., see FIGS. 3A to 4E and 5F) is provided. The package substrate 110 may include a core portion 214 including a first material having a first bulk modulus and a first coefficient of thermal expansion; and a reinforcing portion 212 including a second material having a second bulk modulus and a second coefficient of thermal expansion. The second bulk modulus may be chosen to be greater than the first bulk modulus and the second coefficient of thermal expansion may be chosen to be less than the first coefficient of thermal expansion. The core portion 214 may include a fiber-reinforced polymer material and the reinforcing portion 212 may include silicon, silicon nitride, or a ceramic material. The second bulk modulus may be greater than or equal to 100 GPa and the second coefficient of thermal expansion may be less than 10 ppm/° C.

In various embodiments, the package substrate 110 may have a rectangular geometry with a package length L1 and a package width W1 (e.g., see FIG. 3B) that are each in a first range from approximately 20 mm to approximately 110 mm. The reinforcing portion 212 may have a reinforcement length L2 and a reinforcement width W2 (e.g., see FIG. 3B) that satisfy $1 \text{ mm} \leq L2 \leq L1/2.0$ and $1 \text{ mm} \leq W2 \leq W1/2.0$. Further, the reinforcing portion 212 may include four components each respectively located proximate to a respective corner of the package substrate (e.g., see FIGS. 3B to 4C). The package substrate 110 may further include one or more electrical interconnect layers 216 (e.g., interconnect layers 504, 512, 516), and the package substrate 110 may further have a package thickness T1 that is second range from approximately 300 microns to approximately 2,000 microns (e.g., see FIG. 3A). The core portion 214 may have a core thickness T2 that is in a third range from approximately 200 microns to 1,600 microns, and the reinforcing portion 212 may have a reinforcing thickness T3 that is less than or equal to the core thickness.

In further embodiments, a semiconductor package (300, 400a, 400b, 400c, 400d, 400e) is provided (e.g., see FIGS. 3A to 4E and related description). The semiconductor package (300, 400a, 400b, 400c, 400d, 400e) may include a package substrate 110 including a core portion 214 formed of a first material, and a reinforcing portion 212 formed of a second material; and a semiconductor device (104, 106) attached to the package substrate 110 and electrically coupled to the package substrate 110. In certain embodiments, the semiconductor device (104, 106) may be directly connected to the package substrate 110 or may be connected to an interposer 108 that is connected to the package substrate 110. The semiconductor package (300, 400a, 400b, 400c, 400d, 400e) may further include an external reinforcing member (e.g., first reinforcement structure 204; e.g., see FIGS. 2A to 2C) formed on a surface 126 of the package substrate 110, such that the reinforcing portion 212 of the package substrate is overlapping with a portion of the external reinforcing member 204 in a plan view of the semiconductor package (e.g., see FIGS. 3A to 4E). The package substrate 110 may have a rectangular geometry (e.g., see FIG. 3B) and the reinforcing portion 212 may be formed as four components respectively located proximate to respective four corners of the package substrate 110 (e.g., see FIGS. 3B to 4C). The four components may each have a one of a rectangular shape (e.g., see FIG. 3B), a circular shape (e.g., see FIG. 3C), a triangular shape (e.g., see FIG. 3D), and a polygon shape (e.g., see FIGS. 3E, 3F, and 3G).

The first material (i.e., of the core portion 214) may have a first bulk modulus and a first coefficient of thermal expansion, and the second material (i.e., of the reinforcing portion 212) may have a second bulk modulus that is greater than the first bulk modulus and a second coefficient of thermal expansion that is less than the first coefficient of thermal expansion. The second bulk modulus may be greater than 100 GPa and the second coefficient of thermal expansion may be less than 10 ppm/C. The core portion 214 may include a fiber-reinforced polymer material, and the reinforcing portion 212 may include silicon, silicon nitride, or a ceramic material.

The various disclosed systems and methods provide advantages over existing semiconductor packages having semiconductor devices attached to semiconductor package substrates (e.g., see FIGS. 1A and 1B). In this regard, the disclosed embodiments provide improved methods for assembling semiconductor packages (300, 400a, 400b, 400c, 400d, 400e) that overcome mechanical issues related to thermal expansion mismatch between package components that may otherwise lead to warpage, cracking, delamination, etc. Package substrates (e.g., see FIGS. 2B and 2C) may be reinforced with an external reinforcing member 204 that may reduce or eliminate warpage of the package substrate 110. Thermal expansion coefficient mismatch between the external reinforcing member 204 and other components, however, may give rise to cracking, delamination, and other mechanical degradation of the semiconductor package 200.

To counteract such thermal expansion issues, various disclosed embodiments further provide a reinforcing portion 212 formed within the semiconductor package substrate 110 (e.g., see FIGS. 3A to 4E and 5J). The reinforcing portion 212 may have a higher bulk modulus and lower thermal expansion coefficient relative to other portions of the semiconductor package substrate 110 to thereby reduce or eliminate thermal-stress-induced damage to the semiconductor package substrate 110.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a package substrate comprising a core portion comprising a first material having a first bulk modulus and a first coefficient of thermal expansion and further comprising a reinforcing portion comprising a second material having a second bulk modulus and a second coefficient of thermal expansion, wherein the second bulk modulus is greater than the first bulk modulus and the second coefficient of thermal expansion is less than the first coefficient of thermal expansion, wherein a top surface of the reinforcing portion is coplanar with a top surface of the core portion and a bottom surface of the reinforcing portion is coplanar with a bottom surface of the core portion; and
an external reinforcing member located on a surface of the package substrate and having an areal overlap with the reinforcing portion of the package substrate in a plan view.

2. The structure of claim 1, further comprising a semiconductor die attached to the core portion of the package substrate, wherein the reinforcing portion comprises four components each respectively located proximate to a respective corner of the package substrate and the four components are located outside an area of the semiconductor die in the plan view.

3. The structure of claim 1, further comprising a semiconductor die that is bonded to the center portion, wherein the external reinforcing member is located entirely outside an area of the semiconductor die in the plan view.

4. The structure of claim 3, further comprising an underfill material portion disposed between the semiconductor die and the package substrate, where in the external reinforcing member is located entirely outside an area of the underfill material portion in the plan view.

5. The structure of claim 4, wherein the external reinforcing member is located above a horizontal plane including a bottom surface of the underfill material portion.

6. The structure of claim 3, wherein the reinforcing portion is located within a cavity located in the core portion, and the reinforcing portion is located entirely outside the area of the semiconductor die in the plan view.

7. The structure of claim 3, wherein the external reinforcing member comprises a ring-shaped structure surrounding the area of the semiconductor die and located outside the area of the semiconductor die in the plan view.

8. A semiconductor package, comprising:

a package substrate comprising a core portion comprising a first material and further comprising a reinforcing portion comprising a second material, wherein a top surface of the reinforcing portion is coplanar with a top surface of the core portion and a bottom surface of the reinforcing portion is coplanar with a bottom surface of the core portion;

a semiconductor die attached to, and electrically coupled to, the package substrate; and an external reinforcing member located on a surface of the package substrate and having an areal overlap with the reinforcing portion of the package substrate in a plan view, wherein:

the core portion comprises a fiber-reinforced polymer material; and the reinforcing portion comprises silicon, silicon nitride, or a ceramic material.

9. The semiconductor package of claim 8, wherein the package substrate has a rectangular geometry, and the reinforcing portion comprises four components each respectively located proximate to a respective corner of the package substrate and located outside the area of the semiconductor die in the plan view.

10. The semiconductor package of claim 9, wherein the four components each have a one of a rectangular shape, a circular shape, a triangular shape, and a polygon shape.

11. The semiconductor package of claim 8, wherein:

the first material has a first bulk modulus and a first coefficient of thermal expansion;

the second material has a second bulk modulus that is greater than the first bulk modulus and a second coefficient of thermal expansion that is less than the first coefficient of thermal expansion; and the second bulk modulus is greater than 100 GPa and the second coefficient of thermal expansion is less than 10 ppm/C.

12. The semiconductor package of claim 8, wherein the external reinforcing member is located entirely outside an area of the semiconductor die in the plan view.

13. The semiconductor package of claim 8, further comprising an underfill material portion disposed between the semiconductor die and the package substrate, wherein the external reinforcing member is located entirely outside an area of the underfill material portion in the plan view.

14. The semiconductor package of claim 8, further comprising an interposer located between the semiconductor die and the package substrate, wherein the semiconductor die is electrically coupled to the package substrate through the interposer.

15. A method of forming a semiconductor structure, comprising:

forming a package substrate by performing operations comprising:

providing a core portion comprising a first material having a first bulk modulus and first coefficient of thermal expansion;

forming a cavity in the core portion; and securing a reinforcing portion comprising a second material within the cavity of the core portion, wherein the second material has a second bulk modulus that is greater than the first bulk modulus and a second coefficient of thermal expansion that is less than the first coefficient of thermal expansion, and wherein a top surface of the reinforcing portion is coplanar with a top surface of the core portion and a bottom surface of the reinforcing portion is coplanar with a bottom surface of the core portion;

attaching a semiconductor die to the package substrate; and forming an external reinforcing member on a surface of the package substrate such that the external reinforcing member has an areal overlap with the reinforcing portion in a plan view and does not overlap with the semiconductor die in the plan view.

16. The method of claim 15, further comprising:

forming an electrical interconnect layer over one or both of the core portion and the reinforcing portion; and electrically connecting a semiconductor device to the package substrate such that the semiconductor device is electrically connected to the electrical interconnect layer.

17. The method of claim 15, wherein forming the package substrate further comprises:

forming the core portion as a rectangular-shaped structure;

forming four cavities in the core portion located proximate to respective four corners of the core portion;

forming the reinforcing portion as four components; and securing the four components to the respective four cavities of the core portion.

18. The method of claim 15, further comprising:

forming the core portion as a first structure comprising a fiber-reinforced polymer material; and forming the reinforcing portion as a second structure comprising silicon, silicon nitride, or a ceramic material.

19. The method of claim 15, further comprising applying an underfill material portion between the package substrate and the semiconductor die, wherein the external reinforcing member is formed above a horizontal plane including a bottom surface of the underfill material portion.

20. The method of claim 15, the reinforcing portion comprises four components each respectively located proximate to a respective corner of the package substrate.

* * * * *